(12) United States Patent
Emura (10) Patent No.: US 10,461,219 B2
(45) Date of Patent: Oct. 29, 2019

(54) LIGHT EMITTING ELEMENT (71) Applicant: NICHIA CORPORATION, Anan-shi (JP)

(72) Inventor: Keiji Emura, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/145,786

(22) Filed: Sep. 28, 2018

(65) Prior Publication Data

US 2019/0103514 A1 Apr. 4, 2019

(30) Foreign Application Priority Data

Sep. 29, 2017 (JP) .................................. 2017-190433
Sep. 11, 2018 (JP) .................................. 2018-170051

(51) Int. Cl.
*H01L 33/20* (2010.01)
*H01L 33/38* (2010.01)

(52) U.S. Cl.
CPC .............. *H01L 33/20* (2013.01); *H01L 33/38* (2013.01)

(58) Field of Classification Search
CPC ........ H01L 33/20; H01L 33/38; H01L 33/387
See application file for complete search history.

(56) References Cited

U.S. PATENT DOCUMENTS

| 2007/0148803 A1* | 6/2007 | Yakushiji | ............ H01L 21/0237 |
| | | | 438/33 |
| 2011/0147784 A1 | 6/2011 | Brockley et al. | |
| 2016/0233388 A1* | 8/2016 | Ichikawa | .............. H01L 33/486 |
| 2016/0254413 A1* | 9/2016 | Emura | ..................... H01L 33/24 |
| | | | 257/99 |

FOREIGN PATENT DOCUMENTS

JP 2011-129890 6/2011

* cited by examiner

*Primary Examiner* — Robert G Bachner
*Assistant Examiner* — Molly K Reida
(74) *Attorney, Agent, or Firm* — Mori & Ward, LLP (57) ABSTRACT

A light emitting element includes an n-pad electrode, a light-transmissive electrically conductive film on an upper surface of the p-side semiconductor layer, and a p-pad electrode on an upper surface of the light-transmissive electrically conductive film. When viewed from above, the semiconductor layered structure has a pentagonal outer peripheral shape having a first side, a second side adjacent to the first side at a right angle, a third side adjacent to the first side at a right angle, a fourth side adjacent to the second side at an obtuse angle, and a fifth side adjacent to the third side and the fourth side at an obtuse angle to the third side. The n-pad electrode is disposed near the first side, and the p-pad electrode is disposed closer to a first vertex where the fourth side and the fifth side meet, than the n-pad electrode is disposed to the first vertex.

18 Claims, 8 Drawing Sheets

FIG. 8B ved in the present invention, the layered structure of the described configuration, and shape can be various for purposes, and the shape of the sides can be curved or straight. And an n-pad electrode is disposed on an upper surface of the light-transmissive electrically conductive film, and a p-pad electrode is disposed near the first side, and the p-pad electrode is disposed closer to a first vertex formed by the fourth side and the fifth side than the n-pad electrode is disposed to the first vertex.

LIGHT EMITTING ELEMENT

CROSS-REFERENCE TO RELATED PATENT APPLICATIONS

The present application claims priority under 35 U.S.C. § 119 to Japanese Patent Application No. 2017-190433, filed on Sep. 29, 2017, and Japanese Patent Application No. 2018-170051, filed on Sep. 11, 2018. The entire disclosures of Japanese Patent Application No. 2017-190433 and Japanese Patent Application No. 2018-170051 are incorporated herein by reference.

BACKGROUND OF THE INVENTION

Field of the Invention

The present disclosure relates to a light emitting element.

Discussion of the Background

There has been proposed a light emitting element including a layered structure grown on a growth substrate in order of an n-type semiconductor layer, a light-emitting active region, and a p-type semiconductor layer. A transparent and electrically-conductive current spreading layer is formed on the p-type semiconductor layer, and further, a pad electrode is formed on the upper surface of the current spreading layer.

In such a light emitting element, the semiconductor layer and the current spreading layer have different sheet resistances, and thus the current is not uniformly spread in a plan view, which may result in uneven brightness in the emission. To improve the uniformity in spreading of the current, devising the shapes of the electrodes has been conducted (for example, in Japanese Unexamined Patent Application Publication No. 2011-129890).

However, still in such a configuration, the current tends to concentrate particularly in a region between the p-pad electrode and the n-pad electrode. Meanwhile, regions other than the above, for example, a region around the p-pad electrode and opposite side to the n-pad electrode, smaller current flows, and thus the region tends to have relatively low current density, causing uneven brightness in a plan view of the light emitting element.

Accordingly, the inventor of the present disclosure has determined that a need exists to provide a light emitting element with smaller deviation in electric current density distribution.

SUMMARY OF THE INVENTION

A light emitting element according to one aspect of the present invention includes: a semiconductor layered structure including an n-side semiconductor layer and a p-side semiconductor layer each made of a nitride semiconductor and layered in order from a lower side upward, an n-pad electrode disposed on an upper surface of the n-side semiconductor layer in a region different from a region where the p-side semiconductor layer is disposed, a light-transmissive electrically conductive film disposed on an upper surface of the p-side semiconductor layer, and a p-pad electrode disposed on an upper surface of the light-transmissive electrically conductive film. When viewed from above, the semiconductor layered structure has a pentagonal shape with a first side, a second side adjacent to the first side at a right angle to the first side, a third side adjacent to the first side at a right angle to the first side, a fourth side adjacent to the second side at an obtuse angle to the second side, and a fifth side adjacent to the third side and the fourth side and at an obtuse angle to the third side. The n-pad electrode is disposed near the first side, and the p-pad electrode is disposed closer to a first vertex formed by the fourth side and the fifth side than the n-pad electrode is disposed to the first vertex.

A light emitting element according to another aspect of the present invention includes a semiconductor layered structure including an n-side semiconductor layer and a p-side semiconductor layer each made of a nitride semiconductor and layered in order from a lower side upward, an n-pad electrode disposed on an upper surface of the n-side semiconductor layer in a different region where the p-side semiconductor layer is disposed, a light-transmissive electrically conductive film disposed on an upper surface of the p-side semiconductor layer, and a p-pad electrode disposed on an upper surface of the light-transmissive electrically conductive film. When viewed from above, an outer peripheral shape of the semiconductor layered structure has a hexagonal shape having a first side, a second side adjacent to the first side at a right angle to the first side, a third side adjacent to the first side at a right angle to the first side, a fourth side adjacent to the second side at an obtuse angle to the second side, a fifth side adjacent to the third side at an obtuse angle to the third side, and a sixth side adjacent to the third side and the fourth side at an obtuse angle to the fourth side and to the fifth side, the n-pad electrode is disposed near the first side, and the p-pad electrode is disposed closer to the sixth side than the n-pad electrode is disposed to the sixth side.

Accordingly, a light emitting element with little deviation in the electric current density distribution can be obtained.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments and variations according to the present invention will be described below with reference to the drawings. The embodiments and variations shown below are intended as illustrative to give a concrete form to technical ideas of the present invention, and the scope of the invention is not limited to those described below. Note that, the size, positional relationship and the like in the drawings may be exaggerated for the sake of clarity. In the description below, the same designations or the same reference numerals denote the same or like members and duplicative descriptions will be appropriately omitted. In addition, each of the structural elements according to the embodiments and variations of the present invention may be structured such that a plurality of structural elements may be configured as a single part which serves the purpose of a plurality of elements, on the other hand, a single structural element may be configured as a plurality of parts which serve the purpose of a single element. Description given in one embodiment and one variation can also be applied in other embodiments and other variations. In the specification, the term "on", such as used in "on the layer" etc. includes not only a case where a component is in contact with the layer, but also a case where a component is located above spaced apart from the layer, and also includes a case where a component is located on an intermediate layer that is disposed on the layer.

First Embodiment

Figure 1A:
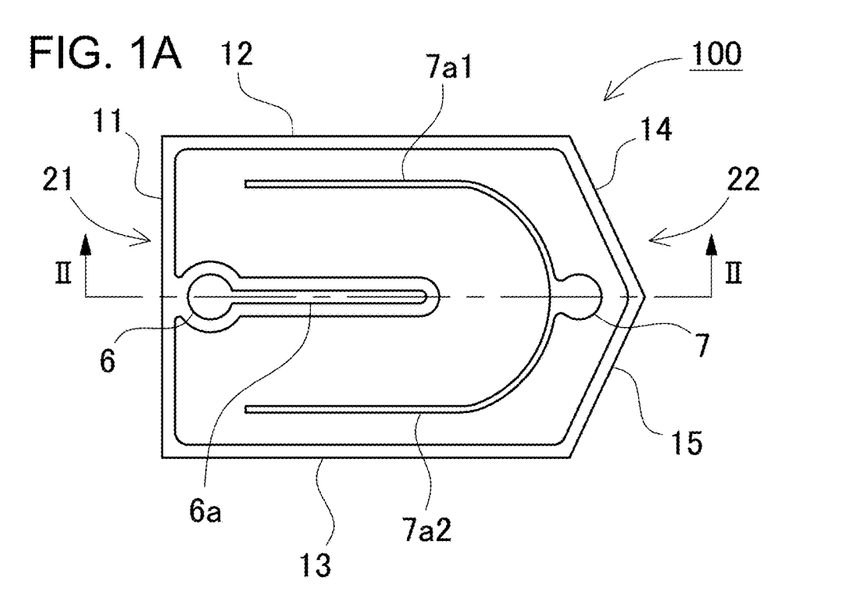
FIG. 1A is a plan view schematically showing a light emitting element according to a first embodiment.
Figure 2:
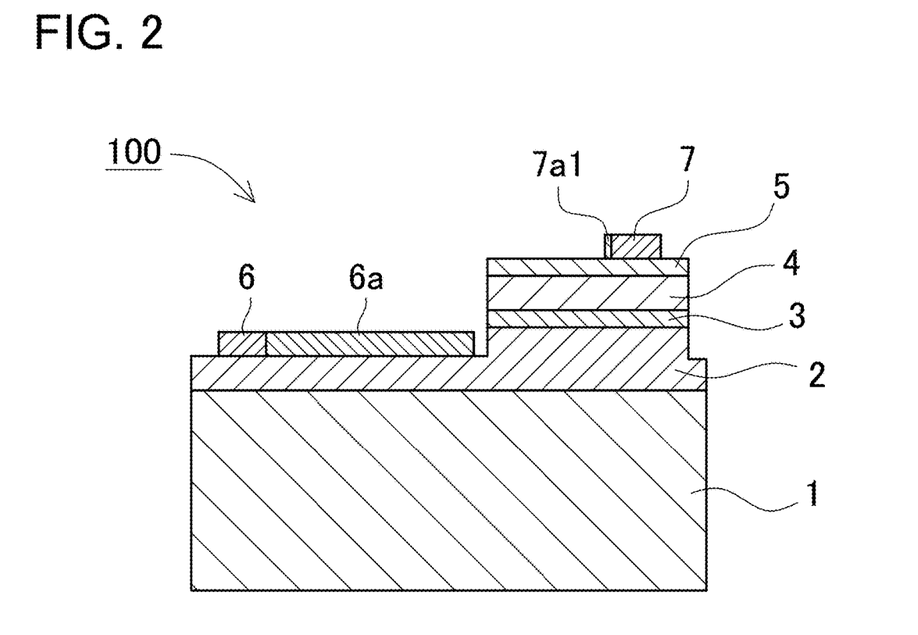
FIG. 2 is a schematic end surface view taken along line II-II of FIG. 1A.

FIG. 1A is a plan view schematically showing a light emitting element 100 according to a first embodiment of the present invention, and FIG. 2 is a schematic end surface view taken along line II-II of FIG. 1A. The light emitting element 100 includes a semiconductor layered structure having an n-side semiconductor layer 2 and a p-side semiconductor layer 4 in this order from a lower side upward, an n-pad electrode 6 disposed above the n-side semiconductor layer 2 at a region different from a region where the p-side semiconductor layer 4 is disposed, and a light-transmissive electrically conductive film 5 disposed on an upper surface of the p-side semiconductor layer 4, and a p-pad electrode 7 disposed on an upper surface of the light-transmissive electrically conductive layer 5.

The light emitting element 100 has a pentagonal shape elongated in one direction in a plan view, as shown in FIG. 1A. In other words, in a plan view, the light emitting element 100 has a pentagonal shape, based on a rectangular shape from which corners at one side are linearly cut to form the first vertex. More specifically, when seen from above, the semiconductor layered structure has a pentagonal outer peripheral shape with a first side 11, a second side 12, a third side 13, a fourth side 14, and a fifth side 15. The second side 12 is adjacent to the first side 11 at a right angle to the first side 11. The third side 13 is adjacent to the first side 11 at a right angle to the first side 11. The fourth side 14 is adjacent to the second side 12 at an obtuse angle to the second side. The fifth side 15 is adjacent to the third side 13 and the fourth side 14 and is at an obtuse angle to the third side 13. In the present specification, the term "-shape" as in "pentagonal shape", "hexagonal shape", or the like may include a shape having one or more rounded vertices.

Figure 1B:
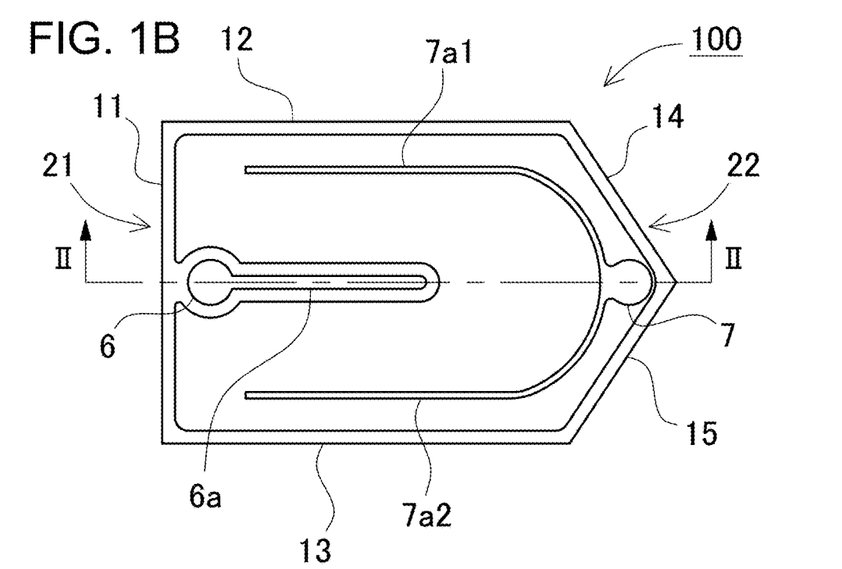
FIG. 1B is a plan view schematically showing a light emitting element according to a variation of the present invention.

The n-pad electrode 6 is disposed near the first side 11. Meanwhile, the p-pad electrode 7 is disposed closer to a first vertex where the fourth side 14 and the fifth side 15 meet, than the n-pad electrode 6 to the first vertex. With this arrangement, the p-pad electrode 7, which tends to have insufficient diffusion of the current to its peripheral region compared to the n-pad electrode 6, is disposed at an end portion where the corners are removed and the n-pad electrode 6 is disposed at an end portion where the corners are retained. Accordingly, uneven distribution of electric current density in the entire light emitting element can be reduced. Further, at least a portion of the p-pad electrode 7 can be located in a region defined by connecting a second vertex where the second side 12 and the fourth side 14 meet, a third vertex where the third side 13 and the fifth side 15 meet, and the first vertex where the fourth side 14 and the fifth side 15 meet. More specifically, as in the variant example shown in FIG. 1B, the center of the p-pad electrode is preferably located closer to the first vertex where the fourth side 14 and the fifth side 15 meet than to the second vertex where the second side 12 and the fourth side 14 meet and to the third vertex where the third side 13 and the fifth side 15 meet. This arrangement can facilitate supply of the electric current to the region between the p-pad electrode 7, the fourth side 14, and the fifth side 15. Accordingly, supply of the electric current can be facilitated to the region tends to have lower current distribution density, and thus uneven distribution of electric current density in the entire light emitting element can be further reduced. In the present specification, the expression "center of the p-pad electrode" refers to the center of a circle that is approximately consistent with the circumferential arc-shape of the pad electrode such as shown in FIG. 1B and other figures. When a shape other than a circular shape is employed for the pad electrode, for example, an elliptic shape is employed, "center of the p-pad electrode" refers to the center of the long axis of the corresponding ellipse.

Substrate

The substrate 1 allows for epitaxially growing the semiconductor layered body to be described below, and examples thereof include a sapphire ($Al_2O_3$) substrate. In the light emitting element 100, such a substrate 1 may be removed, for example by using laser lift-off method.

Semiconductor Layered Body

The semiconductor layered body can be provided on an upper surface of the substrate 1 as shown in FIG. 2. The semiconductor layered body at least includes, in order from the substrate 1 side, an n-side semiconductor layer 2 and a p-side semiconductor layer 4 above a portion of the n-side semiconductor layer 2. With respect to a light emitting region in the layered structure, a semiconductor layer at a side to be connected to the n-pad electrode 6 is the n-side semiconductor layer 2 and a semiconductor layer at a side to be connected to the p-pad electrode 7 is the p-side semiconductor layer 4. The semiconductor layered body according to the present embodiment includes an active layer 3 between the n-side semiconductor layer 2 and the p-side semiconductor layer 4, and the active layer 3 corresponds to the light emitting region. Examples of the materials of such a semiconductor layered body include nitride-based semiconductors represented by $In_XAl_YGa_{1-X-Y}$ (where $0 \leq X$, $0 \leq Y$, $X+Y \leq 1$).

When a semiconductor layered body is formed by using nitride-based semiconductor layers, typically, the p-side semiconductor layer 4 is formed with a thickness smaller than that of the n-side semiconductor layer 2. This is because when activating the p-side semiconductor layer, sufficient activation of p-type dopants may not be obtained unless the semiconductor layer has somewhat small thickness. Further, the p-type dopants added to the p-side semiconductor layer 4 are not easily activated, thus, the electrical resistivity of the p-side semiconductor layer 4 tends to higher than that of the n-side semiconductor layer 2. Accordingly, it is considered that the sheet resistance of the p-side semiconductor layer 4 is higher than the sheet resistance of the n-side semiconductor layer 2, leading to difficulty in diffusing the electric current around the p-pad electrode 7 than around the n-pad electrode 6.

Light-Transmissive Electrically Conductive Film

The light-transmissive electrically conductive film 5 is configured to transmit light from the light emitting region, and as shown in FIG. 2, can be disposed on the upper surface of the p-side semiconductor layer 4. For the light-transmissive electrically conductive film 5, a metal oxide film such as ITO can be used. The light-transmissive electrically conductive film 5 may be disposed not only on the upper surface of the p-side semiconductor layer 4 but also on a region different from the region that the p-side semiconductor layer 4 have been disposed, that is, may be disposed on the upper surface of the n-side semiconductor layer 2. The light-transmissive electrically conductive film 5 can have a thickness in a range of 10 nm to 300 nm.

Pad Electrode

The n-pad electrode 6 and the p-pad electrode 7 are, as shown in FIG. 2, disposed over the semiconductor layered body, in other words, disposed on the same surface side of the semiconductor layered body. In the present embodiment, on the electrode forming surface of the light emitting element 100, the end portion proximate to the n-pad electrode 6 is referred to as a first edge portion 21, and the edge portion proximate to the p-pad electrode 7 is referred to as a second edge portion 22. In FIG. 1A, the left end of the light emitting element 100 is the first edge portion 21, and the right side of the light emitting element 100 is the second end portion 22. In the configuration shown in the figures, the light emitting element 100 has the p-pad electrode 7 that is a second electrode at the second end portion 22 side near the first vertex which is, when compared to a rectangular shape (see, for example, a rectangular-shaped light emitting element 700 of a comparative example shown in FIG. 7), formed by removing two corners at the p-pad electrode 7 side (i.e., the second end portion 22), on the upper surface of the light-transmissive electrically conductive film 5. The outer peripheral shapes of the n-pad electrode 6 and the p-pad electrode 7 when viewed from above can be, for example, circular shapes or near circular shapes. The n-pad electrode 6 and the p-pad electrode 7 can be respectively made of a metal such as Au, Pt, Pd, Rh, Ni, W, Mo, Cr, Ti, Al, or Cu, or an alloy containing at least one of those metals. The n-pad electrode 6 and the p-pad electrode 7 may be respectively made of a single layer, or of a layered film of, for example, Ti/Pt/Au, Cr/Pt/Au, Cr—Rh alloy/Pt/Au, each layered from the semiconductor layered structure side. The thickness thereof can be any appropriate thickness that is used in the art.

Results of Simulation

Figure 7:
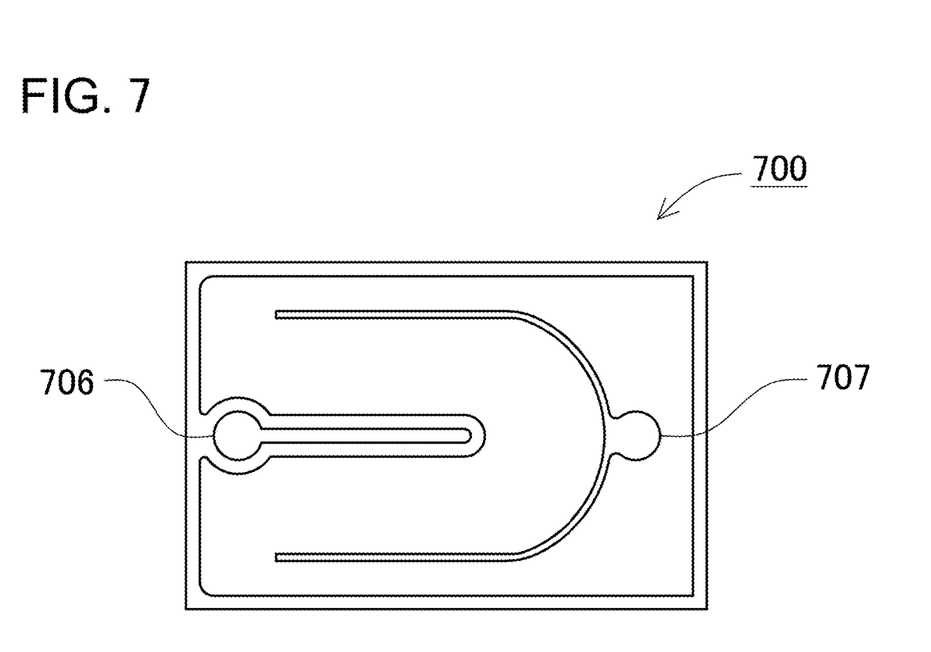
FIG. 7 is a plan view schematically showing a light emitting device according to a comparative example.
Figure 8A:
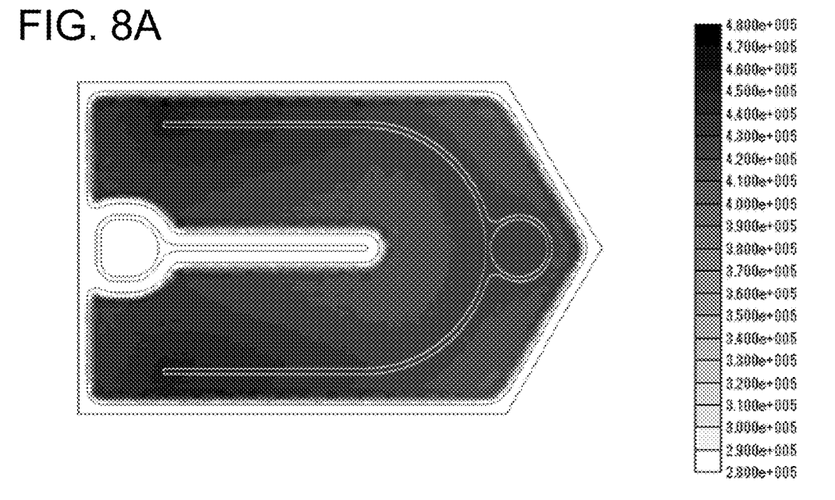
FIG. 8A is a diagram showing a simulation result of electric current density distribution of a light emitting element (FIG. 1A) according to the first embodiment of the present invention.
Figure 8B:
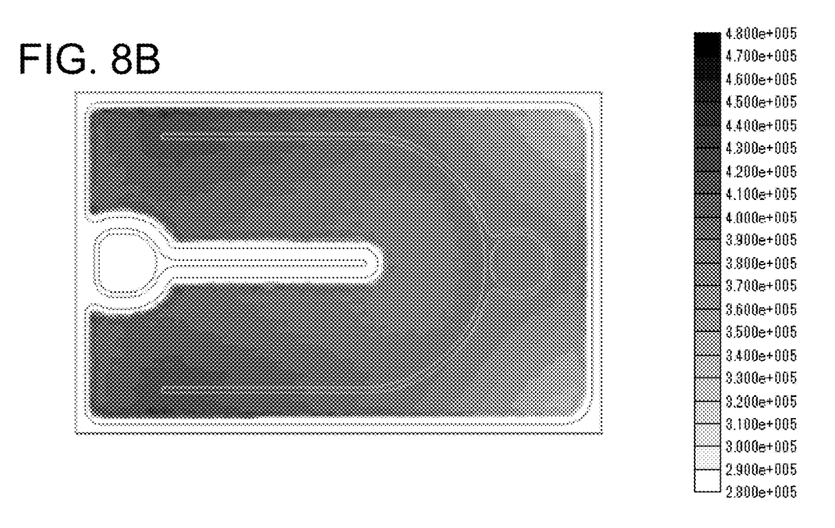
FIG. 8B is a diagram showing a simulation result of electric current density distribution of a light emitting element (FIG. 7) according to a comparative example.

Simulation was conducted to assess the advantage of the light emitting element 100 in terms of the electric current density distribution, and the result of the simulation is shown in FIG. 8A. Also, a plan view of a light emitting element 700 of a comparative example is shown in FIG. 7, and the simulation result of the electric current density distribution in the light emitting element 700 is shown in FIG. 8B. As shown in FIG. 7, the light emitting element 700 of comparative example has a rectangular outer peripheral shape when viewed from above, and from the simulation result shown in FIG. 8B, lower electric current density at two corner portions at the p-pad electrode 707 side, which predicts deviation in the luminance in the longitudinal direction. To the contrary, as shown in FIG. 1A, the light emitting element 100 has a pentagonal shape when viewed from above, which is, when compared to a rectangular shape, two corners at the p-pad electrode 7 side are removed to give the pentagonal shape. With this arrangement, the corners of lower electric current density that is one of the causes of uneven luminance can be eliminated, and further, accordingly, the amount of electric current flowing through the corners can be supplied to inward regions, for example, a region around the p-pad electrode 7 and also toward a region closer to the n-pad electrode 6. As a result, it will be understood that the amount of electric current flowing through the active layer 3, corresponding to the region other than the removed corner portions, is relatively increased, and thus the electric current density distribution across the entire light emitting element becomes uniform as shown in FIG. 8A. Distribution of the amount of the electric current flowing through the corners of a rectangular shape as shown in the comparative example to inward regions allows for a reduction in the deviation in electric current density distribution, and thus more uniform luminance from the entire light emitting element can be expected. That is, the amount of electric current flowing through the corner portions that causes low luminance in conventional light emitting elements can be used efficiently according to the present embodiment. The simulation results indicate that the region of low electric current density located around the tip of the n-side extension electrode of the n-pad electrode 706 in the comparative example as shown in FIG. 8B is improved in the light emitting element 100 as shown in FIG. 8A, which also agrees with more uniform electric current density distribution according to the present embodiment.

In the light emitting element 100, when compared to a rectangular shape, the corner portions at the second end portion 22 side are removed, while the corner portions at the first end portion 21 side are intact. Thus, in a plan view, the shapes at the longitudinal end portions are asymmetric to each other in the light emitting element 100. As shown in the simulation result of the comparative example in FIG. 8B, the corner portions at the n-pad electrode 706 side exhibit sufficiently high luminance compared to other portions. As described above, the light emitting element 100 according to the first embodiment has a shape such that the corner portions at the n-pad electrode 6 side that exhibit high luminance are kept, while eliminating the regions at the p-pad electrode 7 side that exhibit relatively low luminance, to obtain more uniform luminance distribution in the entire light emitting element.

It is preferable that the first vertex where the fourth side 14 and the fifth side 15 meet is located on a perpendicular bisector of the first side 11 and when compared to a rectangular shape, the areas of the two corner portions removed from the rectangular shape is approximately the same. That is, the outer peripheral shape of the semiconductor layered body is preferably symmetric with respect to the perpendicular bisector of the first side 11. Such a configuration can further reduce deviation in the electric current density distribution at the second end portion 22 side where the corner portions are removed with respect to the rectangular shape.

The sizes of the corner portions to be removed with respect to a rectangular shape can be determined appropriately in view of arrangement of the pad electrodes and arrangement of auxiliary electrodes to be described further below. For example, when compared to a rectangular shape with respect to the outer peripheral shape of the semiconductor layered body, the corner portions are removed in triangular shapes preferably such that the second side 12 and the fourth side 14, and the third side 13 and the fifth side 15 are respectively adjacent to an angle in a range of 110 degrees to 150 degrees. With the angle of 110 degrees or greater, regions exhibiting low diffusion of electric current can be effectively removed. With the angle of 150 degrees or less, the p-pad electrode 7 of a predetermined size can be disposed further closer to the first vertex where the fourth side 14 and the fifth side 15 meet, a low electric current density distribution between the p-pad electrode 7 and the first vertex can be avoided.

In other words, the substrate 1 and the semiconductor layered structure of the light emitting element 100 are formed in a pentagonal shape in a plan view, formed by extending a rectangular shape on the extension line of, preferably, the perpendicular bisector of a given side. When the extension in the longitudinal direction creates the area equal to the areas of the two corner portions removed from the second end portion 22 of the rectangular shape, the planar dimension of the light emitting region can be maintained, and thus a reduction in the light output can be reduced or prevented. For example, compared to the light emitting element 700 having a rectangular shape in a plan view as shown in FIG. 7, extending the light emitting element 100 in its longitudinal direction to compensate the areas corresponding to the corner portions allows to maintain the light emitting area. Thus, the planar dimension equivalent to the rectangular shape as of the rectangular light emitting element 700 can be maintained, while obtaining uniform electric current density distribution. Accordingly, regions of low luminance can be reduced, and the light output can be improved.

Figure 3:
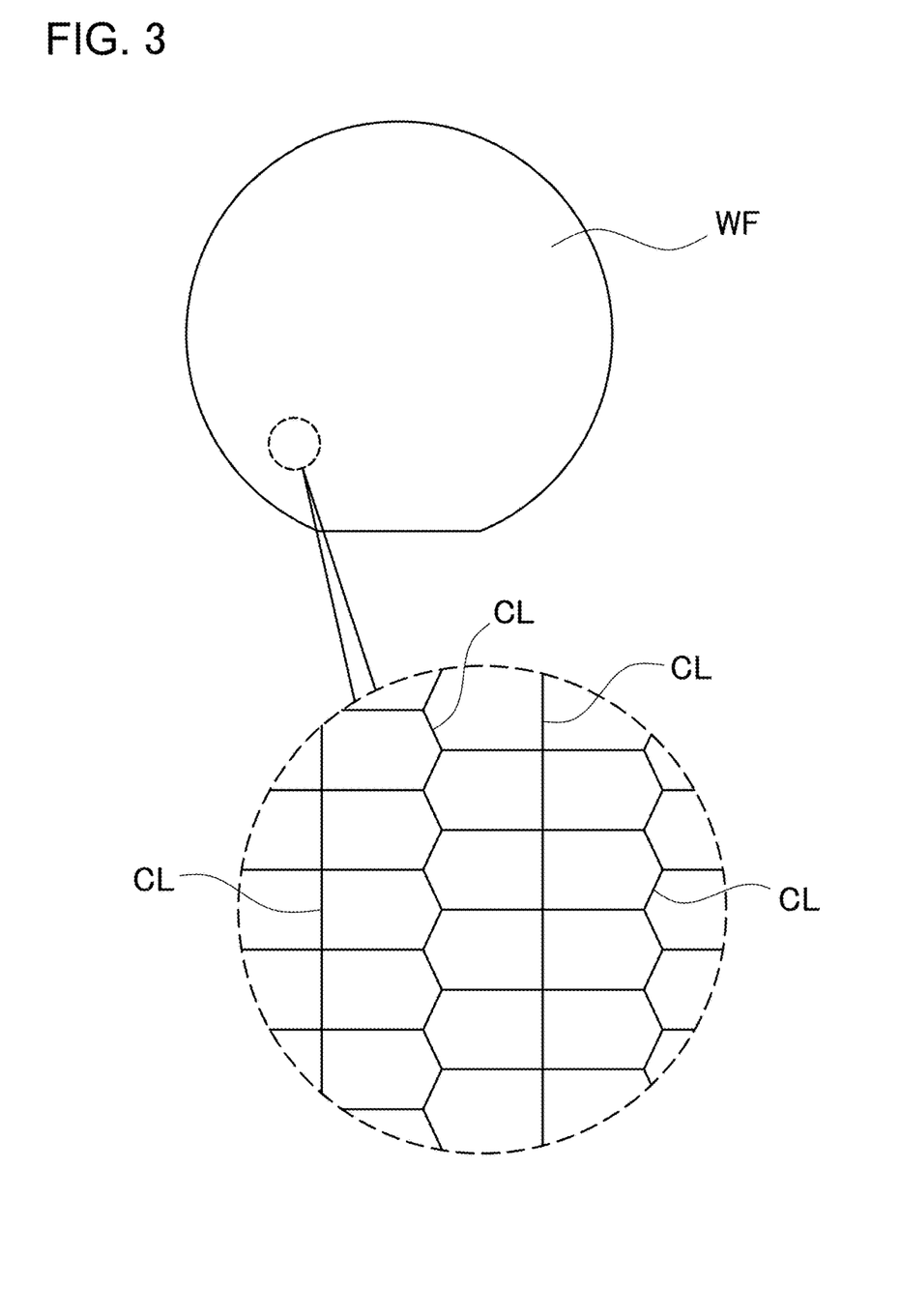
FIG. 3 is a plan view including an enlarged portion schematically showing a dividing guide pattern for singulating the semiconductor wafer into individual light emitting elements according to the first embodiment of the present disclosure.

Further, the light emitting element 100 according to the first embodiment has two adjacent corners of a rectangular shape to facilitate tessellation, which also can reduce waste in manufacturing. For example, when singulating a single semiconductor wafer WF into a plurality of individual light emitting element 100, a singulation pattern indicated by cutting lines CLs as shown in FIG. 3 can be employed. Accordingly, compared to singulation that includes dividing the wafer into light emitting elements of rectangular shape and successive removing of the two corner portions to obtain individual light emitting elements 100, waste produced in the semiconductor wafer WF can be reduced. Thus, a method of manufacturing a light emitting element with smaller amount of waste, that is, with higher yield can be realized.

The n-pad electrode 6 and the p-pad electrode 7 are preferably disposed on a perpendicular bisector of the first side 11. With this arrangement, the n-pad electrode 6 and the p-pad electrode 7 can be spaced apart from each other, while enabling the upper surface, that is the light emitting surface of the light emitting element 100 to be symmetrical to the straight line passing through the n-pad electrode 6 and the p-pad electrode 7. Accordingly, the electric current density distribution symmetrical to the straight line can be obtained.

Auxiliary Electrode

The n-pad electrode 6 and the p-pad electrode 7 may respectively be provided with an auxiliary electrode extending therefrom. For example, on the upper surface of the light-transmissive electrically conductive film 5, a p-side extension electrode 7a extending from the p-pad electrode 7 toward the n-pad electrode 6 side may be provided. With such an auxiliary electrode, the electric current can be more uniformly distributed throughout the light-transmissive electrically conductive film 5.

Either one or a plural number of p-side extension electrodes 7a may be provided. For example, an example shown in FIG. 1A, a first p-side extension electrode 7a1 and a second extension electrode 7a2 both extending from the p-pad electrode 7 in a U-shape toward the n-pad electrode 6 side are disposed on the upper surface of the light-transmissive electrically conductive film 5. The first p-side extension electrode 7a1 and the second p-side extension electrode 7a2 are preferably disposed symmetrical to the perpendicular bisector of the first side 11, that is the straight line passing through the n-pad electrode 6 and the p-pad electrode 7. With this arrangement, the electric current density distribution symmetrical to the perpendicular bisector of the first side 11 that is the straight line passing through the n-pad electrode 6 and the p-pad electrode 7 can be obtained.

Also, an n-side extension electrode 6a extending from the n-pad electrode 6 toward the p-pad electrode 7 side may be provided. In the example shown in FIG. 1A, the n-side extension electrode 6a is disposed on a straight line passing through the n-pad electrode 6 and the p-pad electrode 7. As a result, the first p-side extension electrode 7a1 and the second p-side extension electrode 7a2 are located symmetrically to the extending direction of the n-side extension electrode 6a. With this arrangement, the distance between the n-side extension electrode 6a and the first p-side extending electrode 7a1 and the distance between the n-side extension electrode 6a and the second p-side extension electrode 7a2 can be made constant, which allows for a reduction of uneven flow of the electric current, and thus uniform electric current density distribution can be expected.

Figure 4:
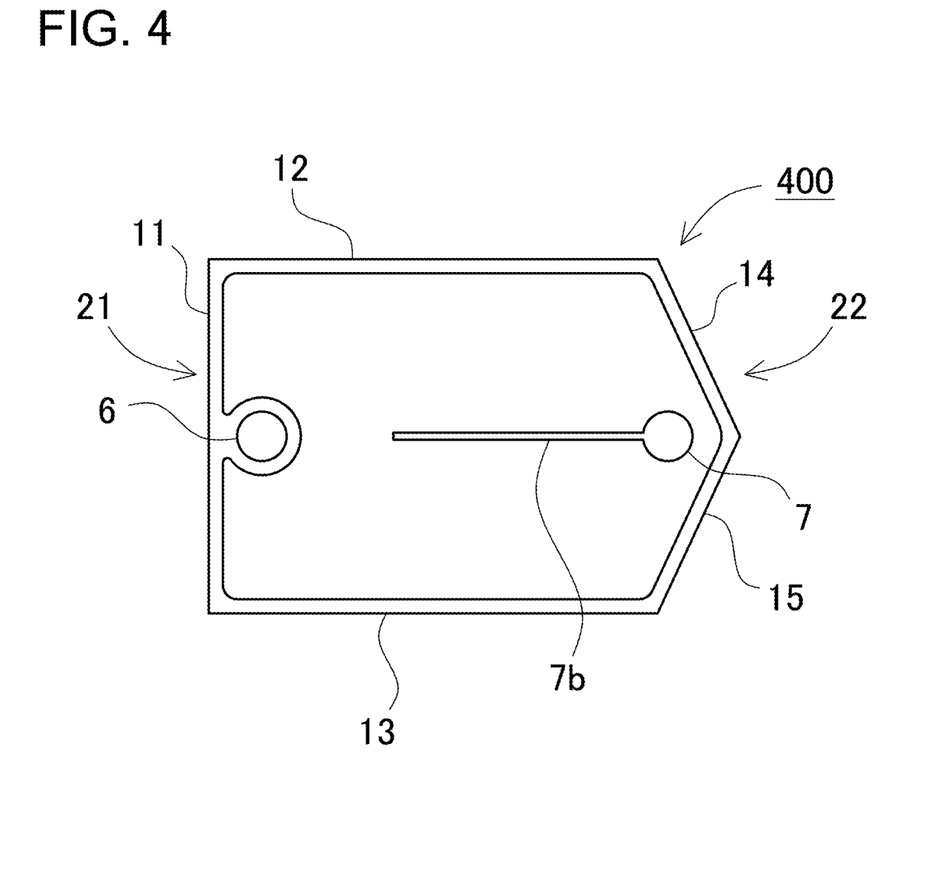
FIG. 4 is a plan view schematically showing a light emitting element according to a variation of the present invention.

In the plan view shown in FIG. 4 illustrates a variation where a single p-side extension electrode is employed. The light emitting element 400 in this example has the p-side extension electrode 7b linearly extended toward the n-pad electrode 6.

The auxiliary electrode(s) as described above can be formed with the metal material(s) used for the p-pad electrode 7 and/or the n-pad electrode 6. The auxiliary electrodes are preferably formed in a line shape with a width smaller than the diameter of the circular p-pad electrode, in a plan view. Thus, the electrode can be extended to obtain uniform distribution of the electric current while preventing or reducing absorption of light by the electrode made of such a metal material (or materials). When the light-transmissive electrically conductive film has a high conductivity, such an auxiliary electrode can be omitted.

Second Embodiment

Figure 5A:
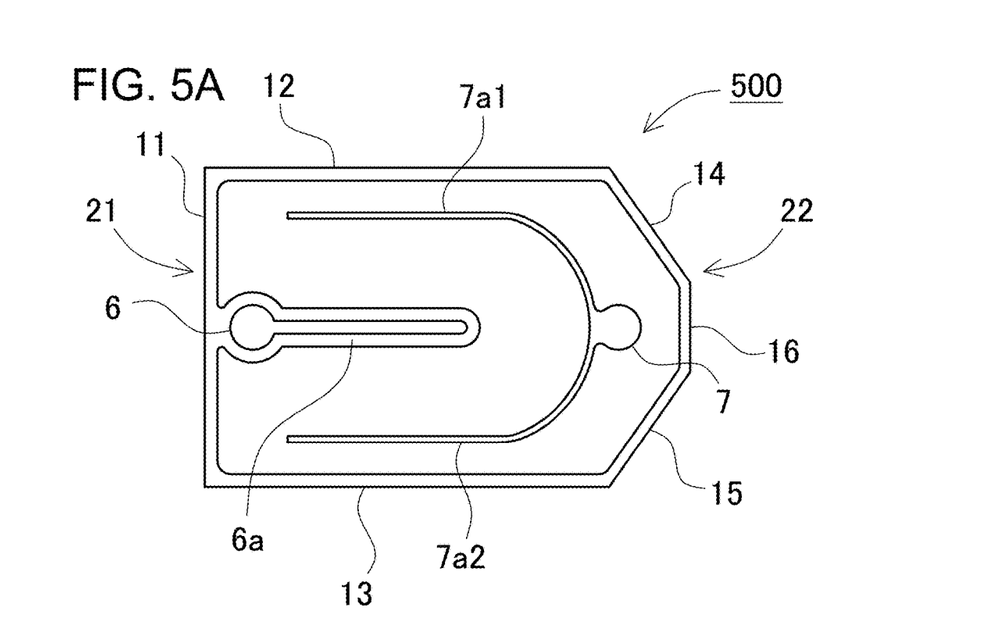
FIG. 5A is a plan view schematically showing a light emitting element according to a second embodiment.
Figure 5B:
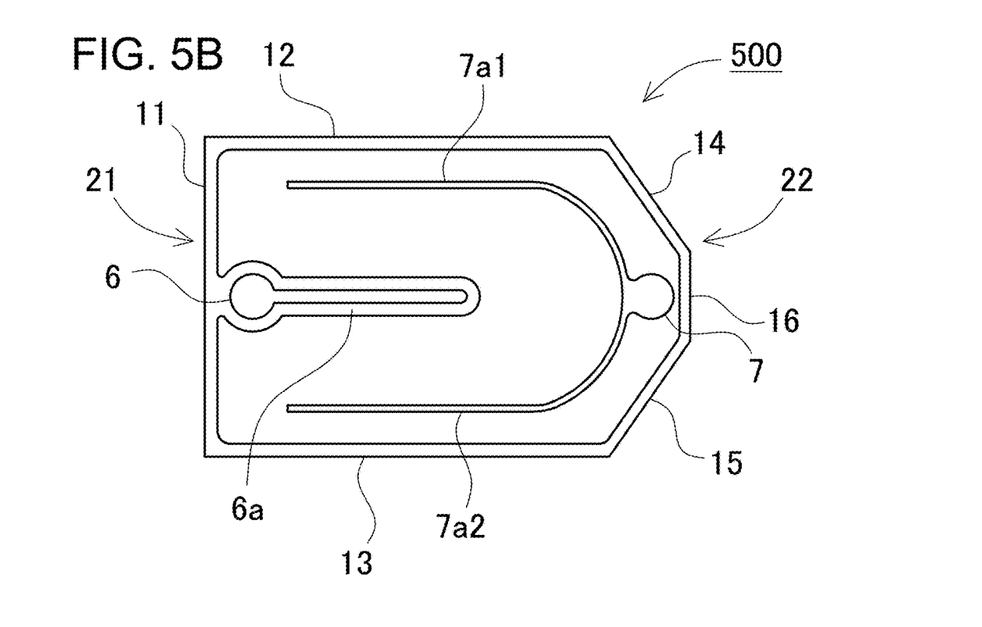
FIG. 5B is a plan view schematically showing a light emitting element according to a variation of the present invention.

In the first embodiment, the shape of the light emitting element in a plan view has been illustrated with a pentagonal shape that is formed, when compared to a rectangular shape, two corners are removed from a given side of a rectangular shape, while another appropriate shape can also be employed. For example, a light emitting element 500 according to a second embodiment shown in FIG. 5A has a hexagonal shape in a plan view. Similar to those of the first embodiment, the light emitting element 500 includes a semiconductor layered structure having an n-side semiconductor layer 2 and a p-side semiconductor layer 4 in this order upward, an n-pad electrode 6 disposed above the n-side semiconductor layer 2 at a region different from a region where the p-side semiconductor layer 4 is disposed, and a light-transmissive electrically conductive film 5 disposed on an upper surface of the p-side semiconductor layer 4, and a p-pad electrode 7 disposed on an upper surface of the light-transmissive electrically conductive layer 5. When viewed from above, that is, in a plan view, the outer peripheral shape of the semiconductor layered body of the light emitting element 500 has a hexagonal shape having a first side 11, a second side 12, a third side 13, a fourth side 14, a fifth side 15, and a sixth side 16. The second side 12 is adjacent to the first side 11 at a right angle to the first side 11. The third side 13 is adjacent to the first side 11 at a right angle to the first side 11. The fourth side 14 is adjacent to the second side 12 at an obtuse angle to the second side 12. The fifth side 15 is adjacent to the third side 13 at an obtuse angle to the third side 13. The sixth side 16 is adjacent to the fourth side 14 and the fifth side 15 at an obtuse angle to the fourth side 14 and to the fifth side 15. The n-pad electrode 6 is disposed near the first side 11. Meanwhile, the n-pad electrode 7 is disposed closer to the sixth side than the n-pad electrode 6 to the sixth side 16. Further, at least a portion of the p-pad electrode 7 can be located in a region defined by connecting a second vertex where the second side 12 and the fourth side 14 meet, a third vertex where the third side 13 and the fifth side 15 meet, a first vertex where the fourth side 14 and the sixth side 16 meet, and a fourth vertex where the fifth side 15 and the sixth side 16 meet. More specifically, as in the variant example shown in FIG. 5B, the center of the p-pad electrode is preferably located closer to the sixth side 16 than to a virtual segment connecting the second vertex where the second side 12 and the fourth 14 side meet and the third vertex where the third side 13 and the fifth side 15 meet. Such a configuration described above may decrease the yield compared to the configuration shown in FIG. 1, but can facilitate obtaining of more uniform distances between the p-pad electrode 7 and sides constituting the semiconductor layered body, namely, the fourth side 14, the fifth side 15, and the sixth side 16. Accordingly, more uniform electric current density distribution can be expected. As described above, in the present specification, the expression "center of the p-pad electrode" refers to the center of a circle that is approximately consistent with the circumferential arc-shape of the pad electrode such as shown in FIG. 5B and other figures. When a shape other than a circular shape is employed for the pad electrode, for example, an elliptic shape is employed, "center of the p-pad electrode" refers to the center of the long axis of the corresponding ellipse.

Variations

Figure 6:
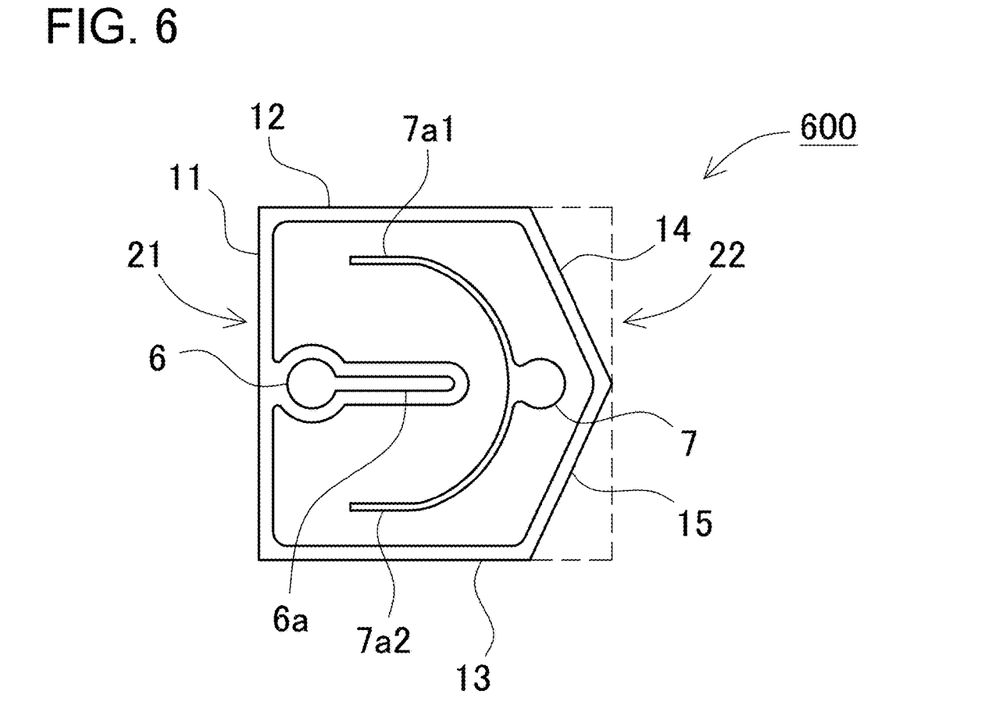
FIG. 6 is a plan view schematically showing a light emitting element according to another variation of the present invention.

In the examples of the light emitting elements illustrated above, the outer peripheral shape of the semiconductor layered body has longer dimensions in parallel to the second side 12 and the third side 13 than to the first side 11. It should be noted that the outer peripheral shape of the semiconductor layered body may also have approximately the same dimensions in the longitudinal direction and the lateral direction, that is, may have a shape approximately or similar to a square shape. For example, a light emitting element 600 according to another variation shown in FIG. 6 has a pentagonal shape, which is, when compared to a square shape, two corners at a given side are cut in triangular shapes. Also in the case described above, other than such a pentagonal shape, a hexagonal shape may also be employed. Also in the variations shown above, as similar to that in the first embodiment, deviation in the electric current density distribution can be reduced, and more uniform luminance in the entire of the light emitting element can be obtained.

As described above, with the light emitting elements according to the embodiments, uneven luminance of the light emitting elements in a plan view due to relatively low electric current density in a region around the p-pad electrode 7 and opposite from the n-pad electrode 6 can be reduced by, when compared to a rectangular shape, removing two adjacent corner portions near the p-pad electrode 7 from the semiconductor layered body. In other words, the regions of lower current flow are eliminated from the semiconductor layered structure, and although the corresponding areas are reduced from the semiconductor layered body, the amount of the electric current corresponding to the areas is supplied to inward regions. Thus, deviation in the electric current density distribution can be reduced and more uniform luminance of the entire light emitting element can be achieved.

Light emitting elements according to the embodiments of the present disclosure exhibit uniform luminance compared to conventional light emitting elements, and have high efficiency, and thus can be suitably employed as the light sources of side-view type light emitting devices, and also, suitably used as light emitting elements for lighting devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light emitting element comprising:
a semiconductor layered structure comprising an n-side semiconductor layer and a p-side semiconductor layer each made of a nitride semiconductor and at least partially overlapped with each other;
an n-pad electrode disposed on an upper surface of the n-side semiconductor layer in a different region from where the p-side semiconductor layer is disposed;
a light-transmissive electrically conductive film disposed on an upper surface of the p-side semiconductor layer; and
a p-pad electrode disposed on an upper surface of the light-transmissive electrically conductive film,
wherein, when viewed in a plan view,
an outer peripheral shape of the semiconductor layered structure has a pentagonal shape having a first side, a second side adjacent to the first side at a right angle to the first side, a third side adjacent to the first side at a right angle to the first side, a fourth side adjacent to the second side at an obtuse angle to the second side, and a fifth side adjacent to the third side and the fourth side at an obtuse angle to the third side, the fourth side and the fifth side meet to form a first vertex,
the n-pad electrode is disposed closer to the first side than to the first vertex, and
the p-pad electrode is disposed closer to the first vertex than the n-pad electrode is disposed to the first vertex.
2. A light emitting element comprising:
a semiconductor layered structure comprising an n-side semiconductor layer and a p-side semiconductor layer each made of a nitride semiconductor and at least partially overlapped with each other;

an n-pad electrode disposed on an upper surface of the n-side semiconductor layer in a different region from where the p-side semiconductor layer is disposed;

a light-transmissive electrically conductive film disposed on an upper surface of the p-side semiconductor layer; and a p-pad electrode disposed on an upper surface of the light-transmissive electrically conductive film, wherein, when viewed in a plan view, an outer peripheral shape of the semiconductor layered structure has a hexagonal shape having a first side, a second side adjacent to the first side at a right angle to the first side, a third side adjacent to the first side at a right angle to the first side, a fourth side adjacent to the second side at an obtuse angle to the second side, a fifth side adjacent to the third side at an obtuse angle to the third side, and a sixth side adjacent to the third side and the fourth side at an obtuse angle to the fourth side and at an obtuse angle to the fifth side, the n-pad electrode is disposed closer to the first side than to the sixth side, and the p-pad electrode is disposed closer to the sixth side than the n-pad electrode is disposed to the sixth side.

3. The light emitting element according to claim 1, wherein at least a portion of the p-pad electrode is disposed in a region defined by connecting a second vertex where the second side and the fourth side meet, a third vertex where the third side and the fifth side meet, and the first vertex where the fourth side and the fifth side meet.

4. The light emitting element according to claim 2, wherein at least a portion of the p-pad electrode is disposed in a region defined by connecting a first vertex where the fourth side and the sixth side meet, a second vertex where the second side and the fourth side meet, a third vertex where the third side and the fifth side meet, and a fourth vertex where the fifth side and the sixth side meet.

5. The light emitting element according to claim 1, wherein the n-pad electrode and the p-pad electrode are respectively disposed on a perpendicular bisector of the first side.

6. The light emitting element according to claim 2, wherein the n-pad electrode and the p-pad electrode are respectively disposed on a perpendicular bisector of the first side.

7. The light emitting element according to claim 3, wherein the n-pad electrode and the p-pad electrode are respectively disposed on a perpendicular bisector of the first side.

8. The light emitting element according to claim 4, wherein the n-pad electrode and the p-pad electrode are respectively disposed on a perpendicular bisector of the first side.

9. The light emitting element according to claim 1, wherein the semiconductor layered structure has an elongated shape that longitudinally extends in a direction parallel to the second side and the third side.

10. The light emitting element according to claim 2, wherein the semiconductor layered structure has an elongated shape that longitudinally extends in a direction parallel to the second side and the third side.

11. The light emitting element according to claim 3, wherein the semiconductor layered structure has an elongated shape that longitudinally extends in a direction parallel to the second side and the third side.

12. The light emitting element according to claim 4, wherein the semiconductor layered structure has an elongated shape that longitudinally extends in a direction parallel to the second side and the third side.

13. The light emitting element according to claim 1, further comprising:

a p-side extension electrode extending from the p-pad electrode toward the n-pad electrode on an upper surface of the light-transmissive electrically conductive film.

14. The light emitting element according to claim 2, further comprising:

a p-side extension electrode extending from the p-pad electrode toward the n-pad electrode on an upper surface of the light-transmissive electrically conductive film.

15. The light emitting element according to claim 1, further comprising:

an n-side extension electrode extending from the n-pad electrode toward the p-pad electrode; and a first p-side extension electrode extending on the upper surface of the light-transmissive electrically conductive film, from the p-pad electrode toward the n-pad electrode, in a direction between the n-side extension electrode and second side.

16. The light emitting element according to claim 2, further comprising:

an n-side extension electrode extending from the n-pad electrode toward the p-pad electrode; and a first p-side extension electrode extending on the upper surface of the light-transmissive electrically conductive film, from the p-pad electrode toward the n-pad electrode, in a direction between the n-side extension electrode and second side.

17. The light emitting element according to claim 16, further comprising:

a second p-side extension electrode extending on the upper surface of the light-transmissive electrically conductive film, from the p-pad electrode toward the n-pad electrode, in a direction between the n-side extension electrode and third side.

18. The light emitting element according to claim 17, further comprising:

a second p-side extension electrode extending on the upper surface of the light-transmissive electrically conductive film, from the p-pad electrode toward the n-pad electrode, in a direction between the n-side extension electrode and third side.

* * * * *